(12) United States Patent
Chen et al.

(10) Patent No.: US 9,646,839 B2
(45) Date of Patent: May 9, 2017

(54) TA BASED OHMIC CONTACT

(71) Applicant: HRL LABORATORIES, LLC, Malibu, CA (US)

(72) Inventors: Mary Y. Chen, Oak Park, CA (US); Rongming Chu, Agoura Hils, CA (US)

(73) Assignee: HRL Laboratories, LLC, Malibu, CA (US)

(*) Notice: Subject to any disclaimer, the term of this patent is extended or adjusted under 35 U.S.C. 154(b) by 0 days.

(21) Appl. No.: 14/762,097

(22) PCT Filed: Jun. 11, 2014

(86) PCT No.: PCT/US2014/041981
§ 371 (c)(1),
(2) Date: Jul. 20, 2015

(87) PCT Pub. No.: WO2015/191065
PCT Pub. Date: Dec. 17, 2015

(65) Prior Publication Data
US 2016/0276161 A1 Sep. 22, 2016

Related U.S. Application Data

(63) Continuation of application No. 14/301,677, filed on Jun. 11, 2014, now abandoned.

(51) Int. Cl.
H01L 21/00 (2006.01)
H01L 29/00 (2006.01)
(Continued)

(52) U.S. Cl.
CPC .... H01L 21/28575 (2013.01); H01L 21/0217 (2013.01); H01L 21/02274 (2013.01);
(Continued)

(58) Field of Classification Search
CPC .......... H01L 21/28575; H01L 21/0217; H01L 21/02274; H01L 29/7781; H01L 29/452; H01L 29/2003
See application file for complete search history.

(56) References Cited

U.S. PATENT DOCUMENTS 6,316,793 B1 * 11/2001 Sheppard ............ H01L 29/1608
257/103
6,849,882 B2 * 2/2005 Walukiewicz ...... H01L 29/7783
257/191

(Continued)

FOREIGN PATENT DOCUMENTS

JP 2010-272766 12/2010

OTHER PUBLICATIONS

Fontsere et al., "Micro and nano analysis of 0.2 Ω mm Ti/Al/Ni/Au ohmic contact to AlGaN/GaN", 2011, Applied Physics Letters, vol. 99, pp. 213504, published Nov. 21, 2011.*
(Continued)

Primary Examiner — Nikolay Yushin
(74) Attorney, Agent, or Firm — Ladas & Parry

(57) ABSTRACT

A method of forming an Ohmic contact including forming a Ta layer in a contact area of a barrier, forming a Ti layer on the first Ta layer, and forming an Al layer on the Ti layer, wherein the barrier layer comprises AlGaN having a 10% to 40% Al composition and a thickness in a range between 30 Å to 100 Å, and wherein the barrier layer is on a channel layer comprising GaN.

31 Claims, 10 Drawing Sheets

(51) Int. Cl.
  *H01L 21/285*  (2006.01)
  *H01L 29/45*  (2006.01)
  *H01L 29/20*  (2006.01)
  *H01L 21/02*  (2006.01)
  *H01L 29/778*  (2006.01)
(52) U.S. Cl.
  CPC ........ *H01L 29/2003* (2013.01); *H01L 29/452* (2013.01); *H01L 29/7786* (2013.01)

(56) References Cited

U.S. PATENT DOCUMENTS

| | | | | |
|---|---|---|---|---|
| 6,982,204 | B2 * | 1/2006 | Saxler | ........ H01L 29/7787 257/E21.407 |
| 2001/0034116 | A1 | 10/2001 | Lee et al. | |
| 2005/0151255 | A1 | 7/2005 | Ando et al. | |
| 2007/0228415 | A1 | 10/2007 | Kanamura et al. | |
| 2010/0066451 | A1 | 3/2010 | Kikkawa et al. | |

OTHER PUBLICATIONS

U.S. Appl. No. 14/301,677, filed Jun. 11, 2014, Chen et al.
A.N. Bright et al., "Correlation of contact resistance with microstructure for Au/Ni/Al/Ti/AlGaN/GaN ohmic contacts using transmission electron microscopy" in Journal of Applied Physics, vol. 89, No. 6, p. 3143-3150. Mar. 15, 2001.
B. De Jaeger et al., "Au-free CMOS-compatible AlGaN/GaN HEMT processing on 200 mm Si substrates", Proceedings of the 2012 $24^{th}$ International Symposium on Power Semiconductor Devices and ICs Jun. 3-7, 2012, pp. 49-52.
Hiroshi Kambayashi et al., "Improving the Performance of GaN Power Devices for High Breakdown Voltage and High Temperature Operation" in Furukawa Review No. 29, Mar. 2006, p. 7-12.
S. H. Lim et al., "Microstructural evidence on electrical properties of Ta/Ti/Al and Ti/Ta/Al Ohmic contacts to n-AlGaN/GaN" Applied Physics Letters vol. 78, No. 24 Jun. 2001, p. 3797-3799.
D. Qiao et al., "Ta-based interface Ohmic contacts to AlGaN/GaN heterostructures" in Journal of Applied Physics, vol. 89, No. 10, p. 5543-5546, May 15, 2001.
"Tantalum-based ohmic contacts for nitride semiconductor transistors" in Semiconductor Today Compounds & Advanced Silicon vol. 6 Issue 3 Apr./May 2011.
International Search Report and Written Opinion for PCT/US2014/041981 mailed Feb. 26, 2015.
From U.S. Appl. No. 14/301,677, filed Jun. 11, 2014, unpublished application and office action.

* cited by examiner

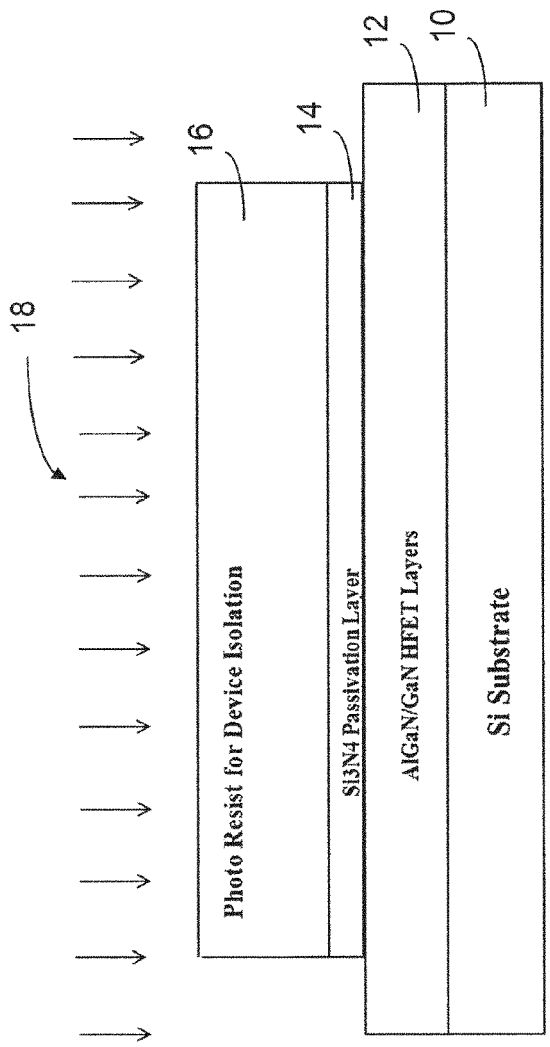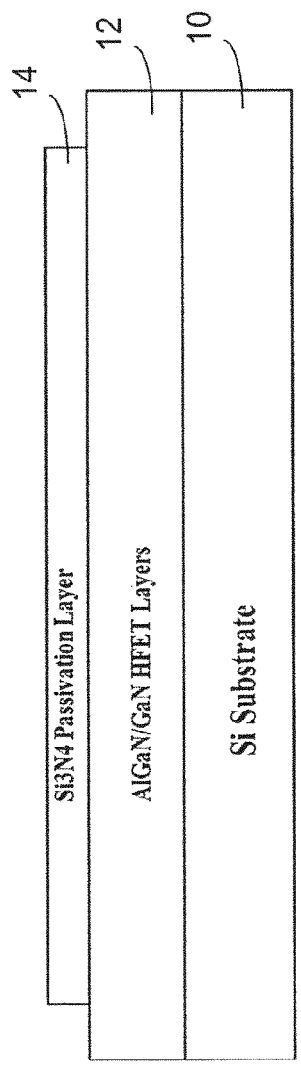

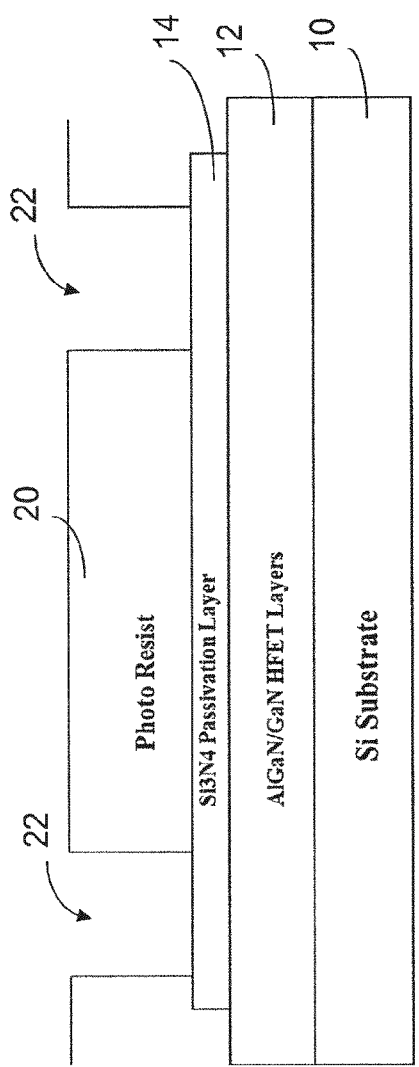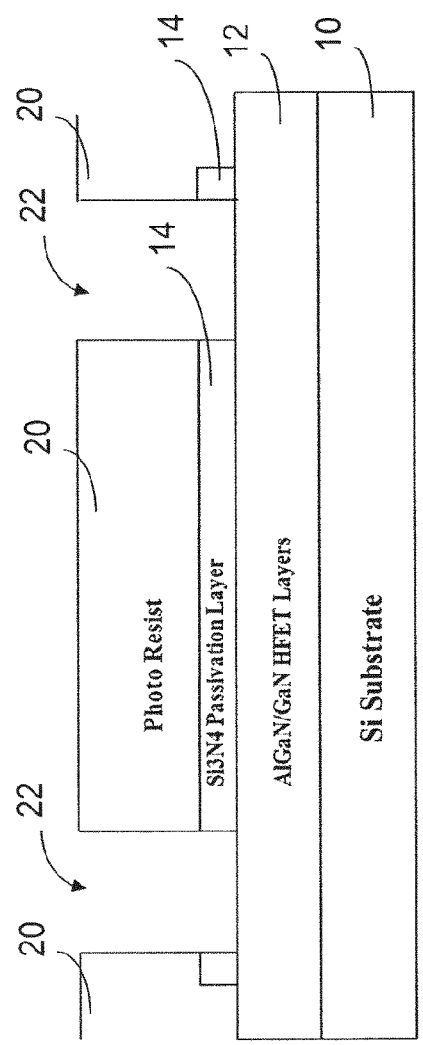

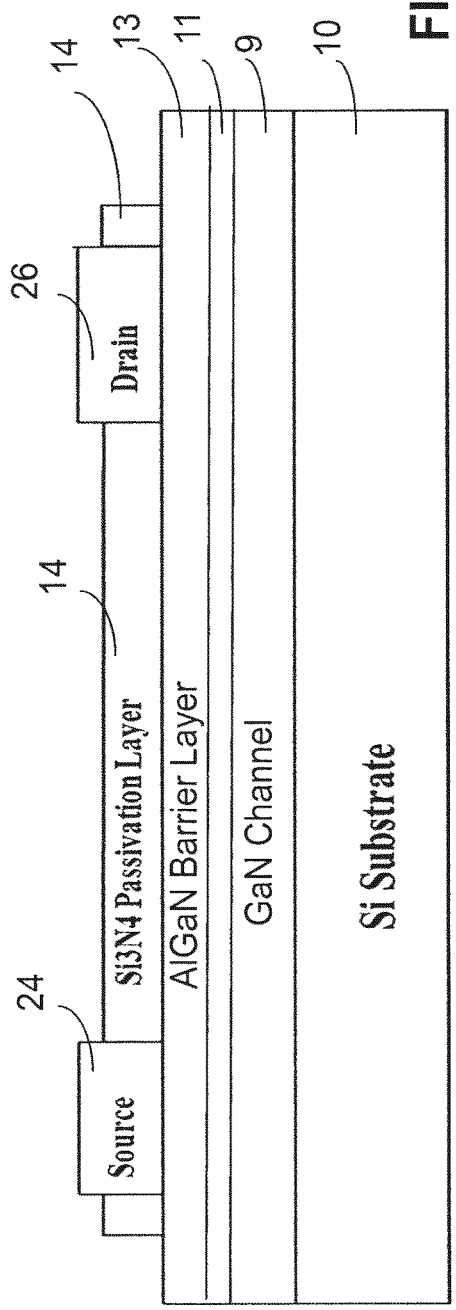
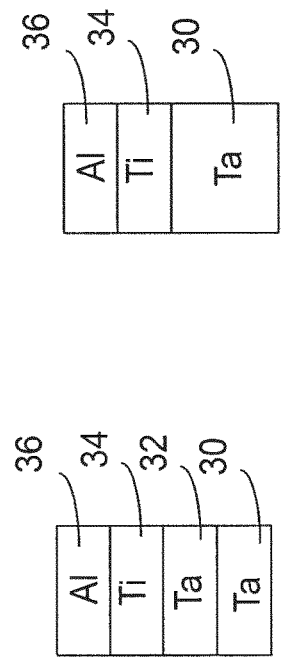
FIG. 7
FIG. 8A
FIG. 8B

TA BASED OHMIC CONTACT

CROSS-REFERENCE TO RELATED APPLICATIONS

This application is related to and claims the benefit and priority to U.S. application Ser. No. 14/301,677 filed Jun. 11, 2014, which is hereby incorporated by reference in its entirety.

STATEMENT REGARDING FEDERAL FUNDING

None

TECHNICAL FIELD

This disclosure relates to Ohmic contacts and in particular to Ohmic contacts for power switch applications. More specifically, this discloses a TA BASED AU-FREE OHMIC CONTACTS IN ADVANCED ALGAN/GAN BASED HFETS AND/OR MOSHFETS FOR POWER SWITCH APPLICATIONS.

BACKGROUND

Au-free Ohmic contacts for AlGaN/GaN based HFETs have advantages over conventional Ohmic contacts. Conventional Ohmic contacts in AlGaN/GaN based HFETs use titanium (Ti) and aluminum (Al), along with cap layers including gold (Au) on Lop and a barrier layer such as Ni, Ti or Pt under. Cap layers with Au are supposed to reduce contact resistance, but the role of top layers, particularly Au, is not well understood, as reported by A. N. Bright et al "Correlation of contact resistance with microstructure for Au/Ni/Al/Ti/AlGaN/GaN ohmic contacts using transmission electron microscopy" in Journal of Applied Physics, Vol. 89, No. 6, page 3143-3150.

Typical annealing temperatures for conventional Ohmic contacts are quite high, and the surface morphology is not smooth. Even with a barrier layer underneath, Au spikes may still punch through the metal stack underneath and may reach the metal/semiconductor interface, which results in low reliability. Such has been observed, as reported by A. N. Bright et al., "Correlation of contact resistance with microstructure for Au/Ni/Al/Ti/AlGaN/GaN ohmic contacts using transmission electron microscopy" in Journal of Applied Physics, Vol. 89, No. 6, page 3143-3150.

Au-free Ohmic contacts for AlGaN/GaN based HFETs and/or MISHEMTs on Si substrates have been described. For example, Hiroshi Kambayashi et al. describe "Improving the Performance of GaN Power Devices for High Breakdown Voltage and High Temperature Operation" in Furukawa Review No. 29, 2006, page 7-12; and B. De Jaeger et al. describe "Au-free CMOS-compatible AlGaN/GaN HEMT processing on 200 mm Si substrates", in Proceeding of the 2012 24$^{th}$ ISPSD page 49-52". These two publications report Ohmic layers that are Ti/AlSi/Mo and Ti/Al/Ti/TiN, respectively.

D. Qiao et al. describe "Ta-based interface Ohmic contacts to AlGaN/GaN heterostructures" in Journal of Applied Physics, Vol. 89, No. 10, page 5543-5546, 2001; however the annealing temperature required is quite high with a rapid thermal annealing (RTA) temperature of 950° C. for 4 minutes. Extreme high annealing temperature may either destroy heterostructures or require a complicated cap layer during annealing.

"Tantalum-based ohmic contacts for nitride semiconductor transistors" in Semiconductor Today Compounds & Advanced Silicon Vol. 6 Issue 3 April/May 2011 describes using a lower temperature than the Al melting temperature of 660° C. for annealing; however, obtaining acceptable results using the described technique may be challenging to repeat and it may be difficult to obtain an Rc lower than 1 Ωmm.

S. H. Lim et al. in "Microstructural evidence on electrical properties of Ta/Ti/Al and Ti/Ta/Al Ohmic contacts to n-AlGaN/GaN" Applied Physics Letters Vol. 78, No. 24, page 3797-3799 show the advantages of having Ta at the bottom as compared with having Ti at the bottom of an Ohmic contact layer. They describe a thicker TaN layer formed at the metal/semiconductor interface with Ta at bottom, as compared to the thickness of a TiN layer formed at the same interface with Ti at bottom of Ohmic layer stack. The specific contact resistivity of Ta/Ti/Al is orders of magnitude lower than that of Ti/Ta/Al.

What is needed is an improved Ohmic contact, especially for power switching applications, which use large devices with high breakdown voltage and long term reliability requirements. Low Ohmic contact resistance is also desired. The embodiments of the present disclosure attempt to answer these and other needs.

SUMMARY

In a first embodiment disclosed herein, a method of forming an Ohmic contact comprises forming a Ta layer in a contact area of a barrier layer, forming a Ti layer on the first Ta layer, forming an Al layer on the Ti layer, wherein the barrier layer comprises AlGaN having a 10% to 40% Al composition and a thickness in a range between 30 Å to 100 Å, wherein the barrier layer is on a channel layer comprising GaN.

In another embodiment disclosed herein, a method of forming an Ohmic contact for a field effect transistor comprises a Ta layer in a contact area of a barrier layer, a Ti layer on the first Ta layer, and an Al layer on the Ti layer, wherein the barrier layer comprises AlGaN having a 10% to 40% Al composition and a thickness in a range between 30 Å to 100 Å, and wherein the barrier layer is on a channel layer comprising GaN.

These and other features and advantages will become further apparent from the detailed description and accompanying FIGS. that follow. In the FIGS. and description, numerals indicate the various features, like numerals referring to like features throughout both the drawings and the description.

BRIEF DESCRIPTION OF THE DRAWINGS

FIG. 3 shows implanting ions for device isolation in accordance with the prior art;

FIG. 4 shows the vertical layer structure after photo-resist removal in accordance with the prior art;

FIG. 5 shows the vertical layer structure after Ohmic level lithography with the Ohmic contact area opened in accordance with the present disclosure;

FIG. 6 shows the vertical layer structure after removing the passivation layer in the Ohmic contact area in accordance with the present disclosure;

FIG. 7 shows the vertical layer structure after ohmic metal evaporation in accordance with the present disclosure;

FIGS. 8A and 8B show layers of an Ohmic contact in accordance with the present disclosure;

DETAILED DESCRIPTION

Figure 1:
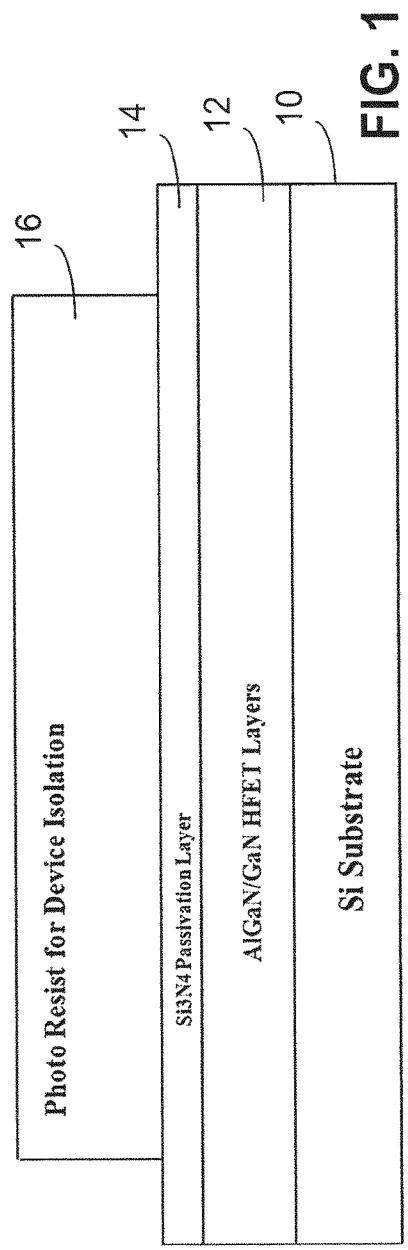
FIG. 1 shows a starting vertical layer structure, with photo resist for device isolation in accordance with the prior art.

In the following description, numerous specific details are set forth to clearly describe various specific embodiments disclosed herein. One skilled in the art, however, will understand that the presently claimed present disclosure may be practiced without all of the specific details discussed below. In other instances, well known features have not been described so as not to obscure the present disclosure.

Ta based Au-free Ohmic contacts are described herein for advanced AlGaN/GaN based HFETs and/or MOSHFETs on Si substrates for high power switch applications and other applications. The Ohmic contact metal stack of the present disclosure has a metal stack of Ta, Ta, Ti and Al with 200 Å, 200 Å, 500 Å, and 500 Å thicknesses, respectively. Ta is on the bottom of the metal stack in contact with the semiconductor. The metal stack may be deposited by e-beam evaporations at a rate of 0.5 A/sec-2 A/sec for the Ta layers with the system cooled down to 30° C. after each Ta layer is formed. The metal stack is annealed using rapid thermal annealing (RTA) at a temperature ranging from 750° C.-850° C., for 10 sec-60 sec. The RTA time may typically be 30 sec. The annealing temperature in this disclosure is significantly lower than the temperature used for the Ta-based Ohmic contacts described by D. Qiao et al in "Ta-based interface Ohmic contacts to AlGaN/GaN heterostructures" Journal of Applied Physics, Vol. 89, No. 10, page 5543-5546, which require an RTA temperature of 950° C. for 4 minutes. Ohmic contacts according to the present disclosure can provide a contact resistance of less than or equal to 0.5 Ωmm.

The epi-structure upon which the Ohmic contact is used may contain an AlGaN barrier layer with 10% to 40% of Al and a thickness in the range of 30 Å to 100 Å. A spacer layer of AlN with a thickness of 10 Å may be under the barrier layer of AlGaN, and a GaN layer may be below the spacer layer. Preferably $Si_3N_4$ is used as a surface passivation layer, and the Si3N4 passivation layer may be deposited on top of epi-layers before device processing, for example by MOCVD; however, other passivation materials may be used. Alternatively, the Si3N4 passivation layer may be deposited after Ohmic contact processing, for example by plasma-enhanced chemical vapor deposition (PECVD), or both before and after Ohmic contact formation, depending on device design. Thickness of the Si3N4 passivation layer may be 20 nm or thicker.

The Ta based Au-free Ohmic contacts of this disclosure provide a smooth surface morphology with well-defined peripheries to obtain a low contact resistance Rc. Low-resistance contacts are needed for high breakdown voltage devices to reduce losses and self-heating for power switch applications. The smooth surface morphology and well defined feature peripheries also enhance long term performance and reliability.

The Ta/Ta/Ti/Al Ohmic metal stack may formed by photo lithography, evaporation and liftoff or by sputtering and dry etching, both of which are standard processing techniques for refractory metal contacts. The Ohmic contacts of the present disclosure have the advantage of a metal stack that is compatible with, and hence can be implemented into, low cost Si-CMOS processing technologies. The low contact resistance of 0.5 Ωmm or less that can be obtained for advanced AlGaN/GaN based HFETs and/or MOSHFETs on Si substrates is well suited for applications in high power switches.

FIGS. 1-9 show an example of a process for forming Ta based Au-free Ohmic contacts. FIG. 1 shows an example schematic of a starting vertical layer structure of a HFET device with a Si substrate 10, AlGaN and GaN HEFT layers 12, and a $Si_3N_4$ passivation layer 14, which may be deposited by metal organic chemical vapor deposition (MOCVD). $Si_3N_4$ is preferred for the passivation layer 14, because it has properties that can withstand rapid thermal annealing (RTA). The AlGaN barrier layer may be 25% Al, be undoped and have a 30-100 Å thickness. The GaN channel layer may have a 1 μm thickness. A photo resist layer 16 is deposited and patterned for device isolation.

Figure 2:
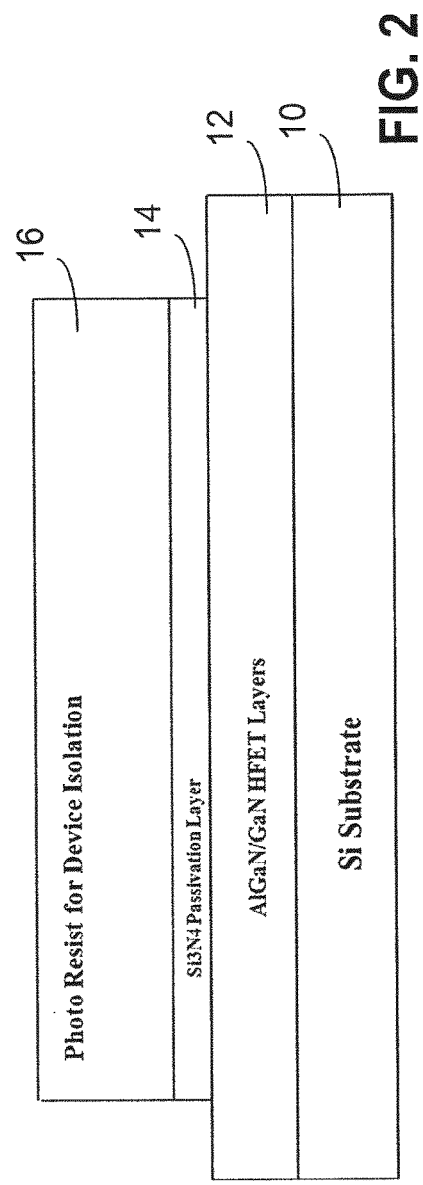
FIG. 2 shows the vertical layer structure after passivation layer etching for device isolation in accordance with the prior art.

FIG. 2 shows the vertical structure of the device after etching the $Si_3N_4$ passivation layer 14 to define a device, and FIG. 3 shows ions 18 being implanted outside the $Si_3N_4$ passivation layer 14 for device isolation. FIG. 4 shows the vertical structure after removal of the photo-resist layer 16.

Then as shown in FIG. 5, photo-resist 20 is deposited and patterned using lithography so that the Ohmic contact areas 22 are open.

Then as shown in FIG. 6 the $Si_3N_4$ passivation layer is removed in the Ohmic contact areas 22 by etching. If a gate dielectric layer is deposited prior to the Ohmic contact formation process, and/or a recess is required for the AlGaN barrier layer, depending on thickness of AlGaN, these layers may also be removed at this step before Ohmic metal depositions.

FIG. 7 shows the vertical structure after Ohmic contacts are formed for the source contact 24 and the drain contact 26 of, for example, an HFET. The layers of the Ohmic contacts, as shown in FIG. 8A, may be the following: a first Ta layer 30 200 Å thick on the AlGaN barrier layer 13 over the GaN channel layer 9, a second Ta layer 32 200 Å thick on the first Ta layer 30, a Ti layer 34 500 Å thick on the second Ta layer 32, and an Al layer 36 500 Å thick on the Ti layer 34. The Ta layer 30 may be deposited with a Ta evaporation rate of 0.5 Å/sec-2 Å/sec. After the Ta layer 30 evaporation process, the system and the Ta layer 30 may be cooled down to 30° C. The Ta layer 32 may also be deposited with a Ta evaporation rate of 0.5 Å/sec-2 Å/sec, and after the evaporation process, the system and the Ta layer 32 may be cooled down to 30° C. The AlGaN barrier layer 13 preferrably has a 10% to 40% Al composition and a thickness in a range between 30 Å to 100 Å. A AlN spacer layer 11 having a thickness of 10 Å may be between the barrier layer 13 and the channel layer 9.

Rather than depositing by evaporation the first Ta layer 30 to be 200 Å thick on the AlGaN barrier layer 13, and then depositing a second Ta layer 32 200 Å thick on the first Ta layer 30, the first Ta layer 30 may be deposited by evaporation to be 400 Å thick on the AlGaN barrier layer 13, and then the 500 Å thick Ti layer 34 is deposited on the first Ta layer 30, and the 500 Å thick Al layer 36 is deposited on the Ti layer 34, as shown in FIG. 8B. In this embodiment the cooling steps between depositions may be used or eliminated.

After Ohmic metal evaporation, RTA (rapid thermal annealing) is performed with a temperature range for 750° C.-850° C., for 10 sec to 60 sec. Typically the RTA time may be 30 sec.

Figure 9:
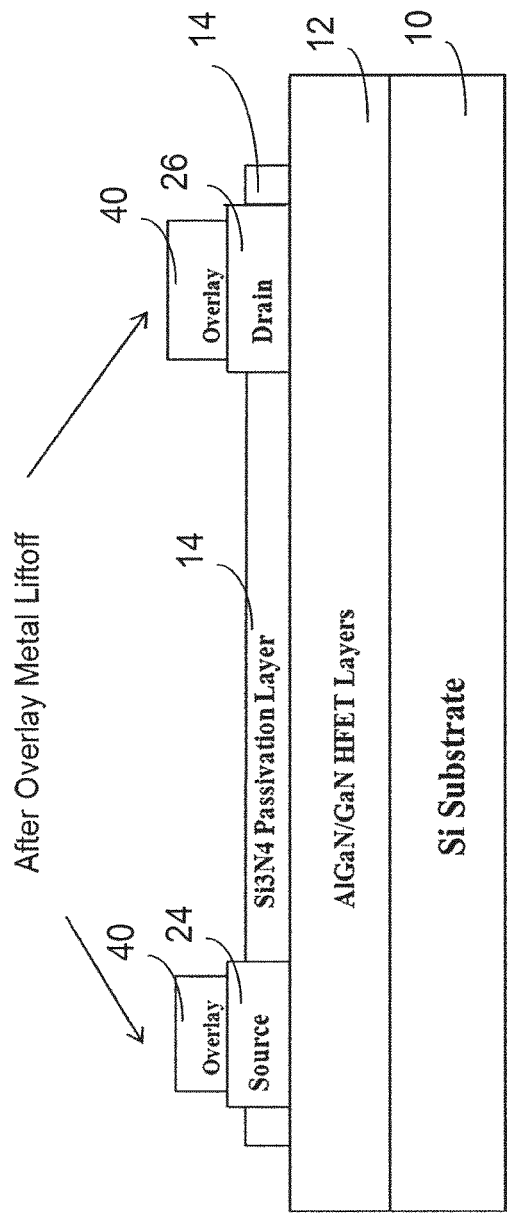
FIG. 9 shows the vertical layer structure after overlay metal deposition in accordance with the present disclosure.

FIG. 9 shows the vertical structure after overlay metal 40 is deposited on the Ohmic contact 24 or 26.

Figure 10A:
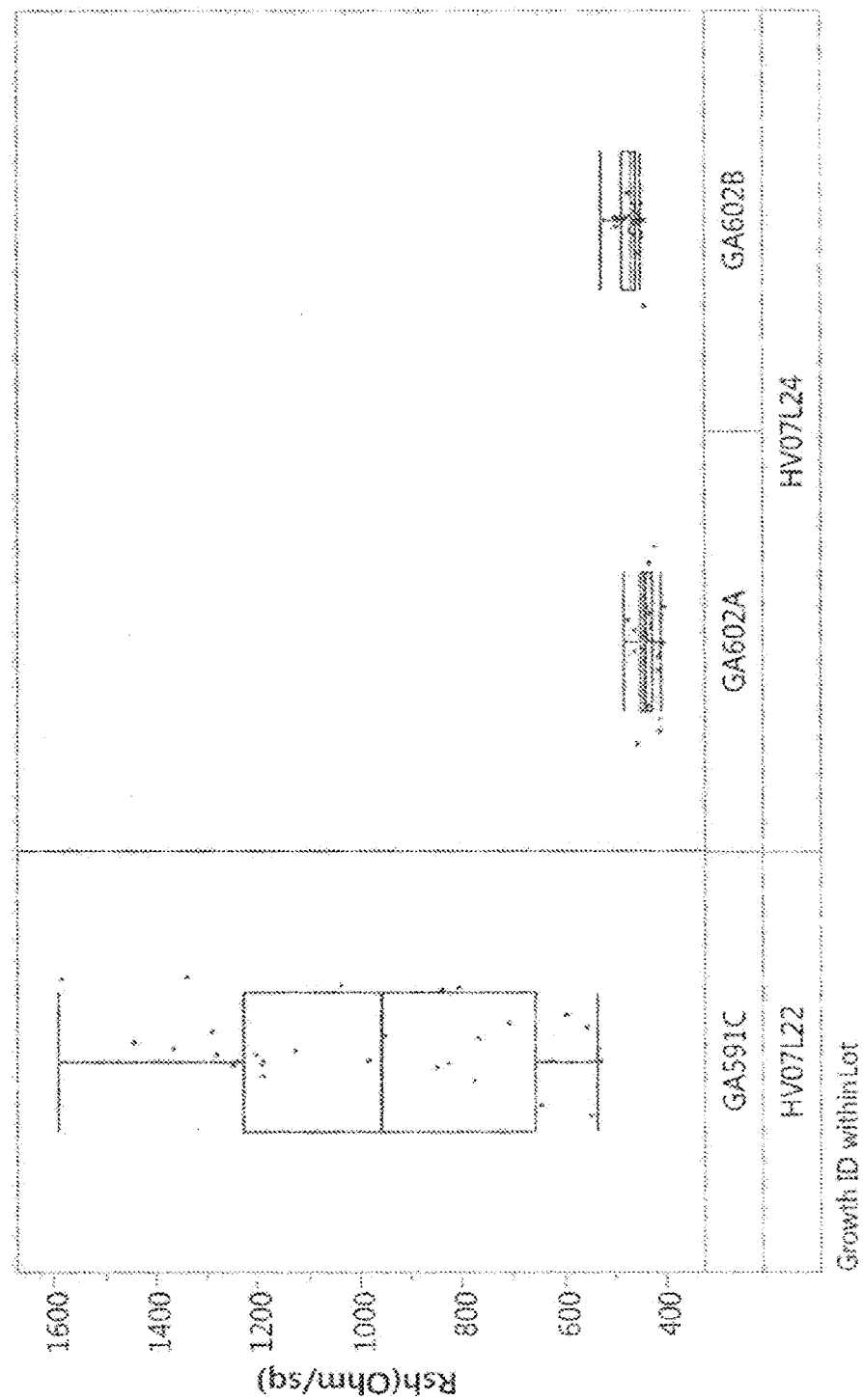
FIG. 10A shows Rsh and FIG. 10B shows Rt from transmission line measurements (TLMs) made in lots HV07L22 and HV07L24 in accordance with the present disclosure.
Figure 10B:
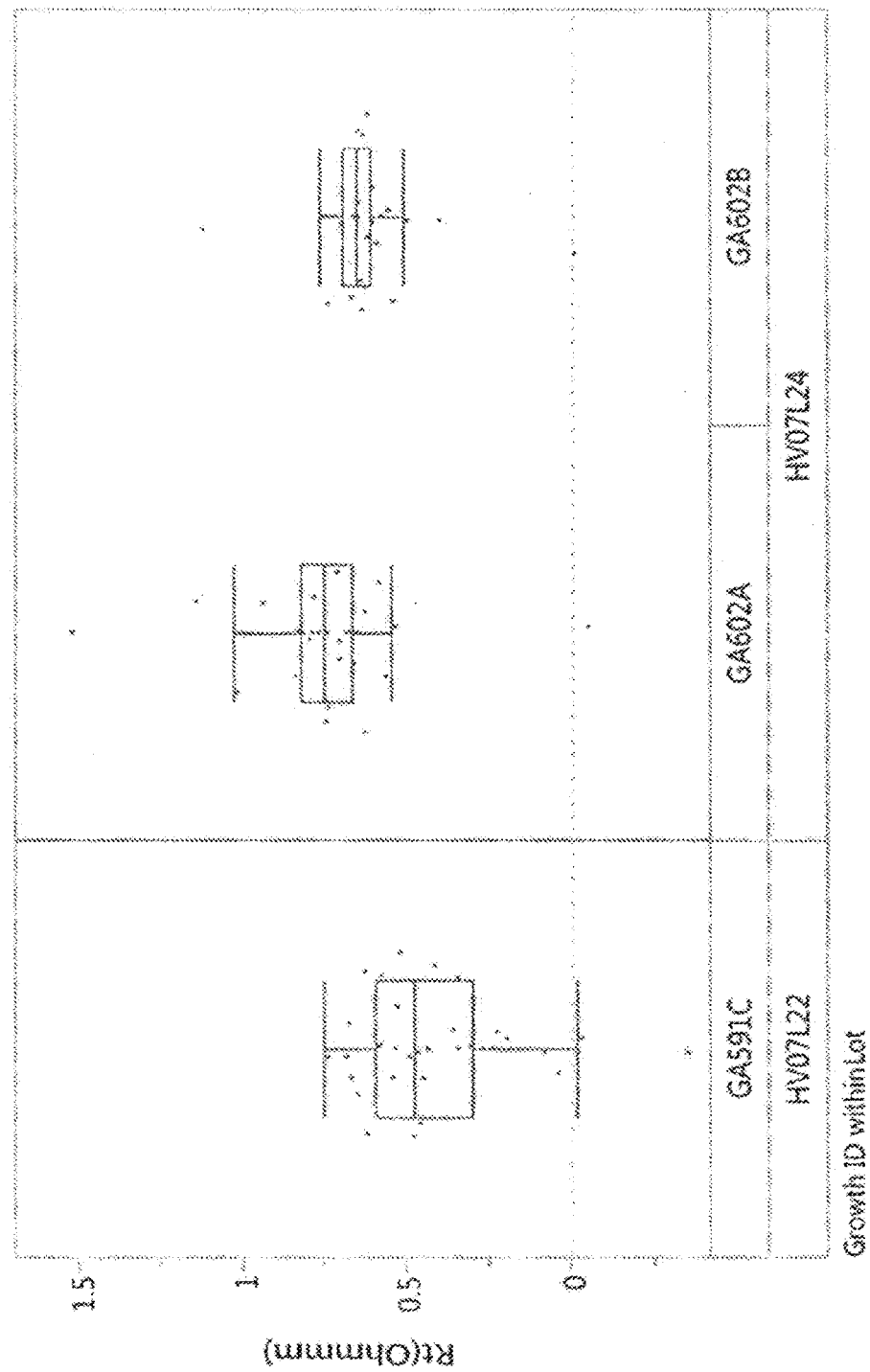
Figure 11A:
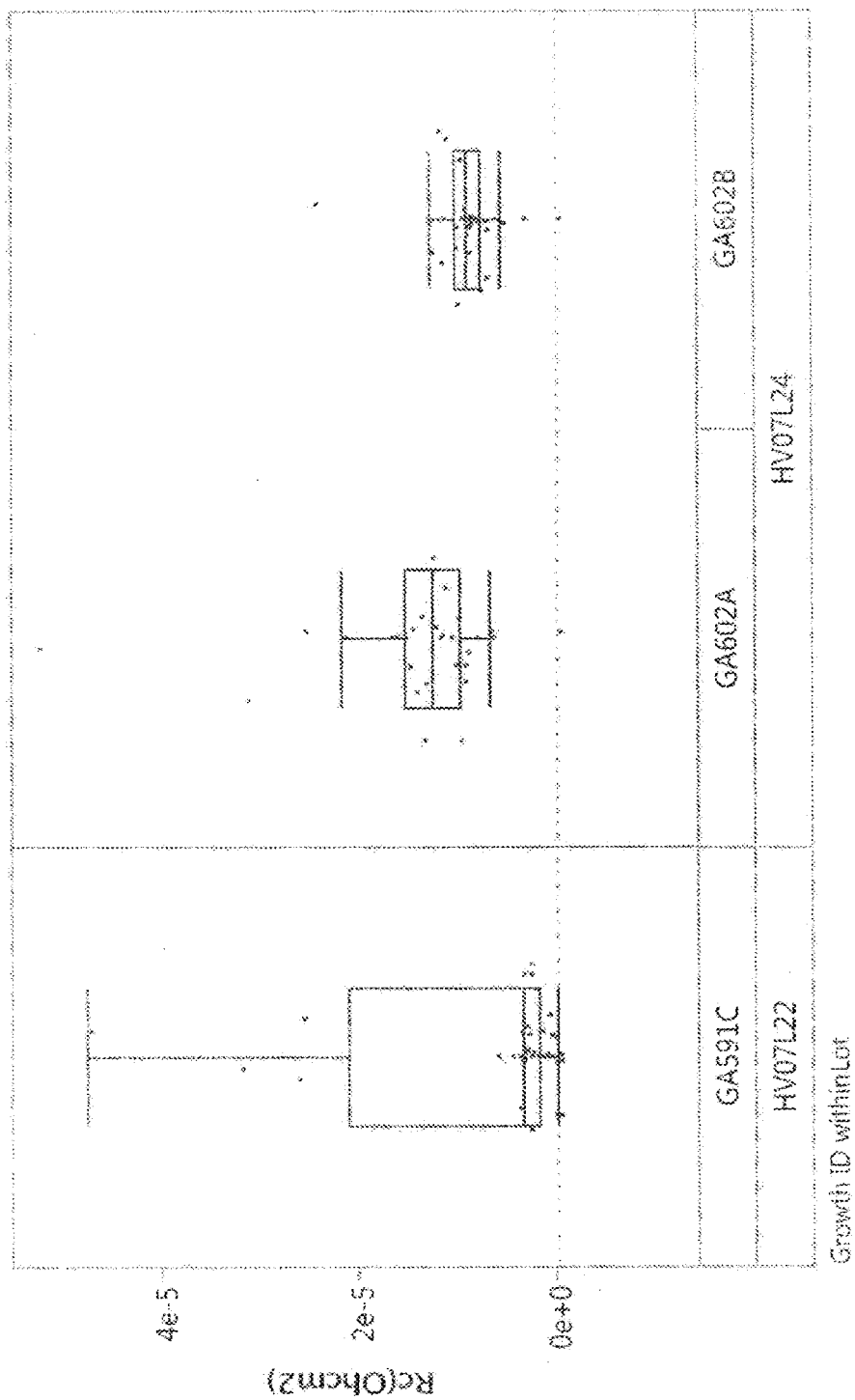
FIG. 11A shows Rc and FIG. 11B shows the transfer length (Lt) from TLM measurements made in lots HV07L22 and HV07L24 in accordance with the present disclosure.
Figure 11B:
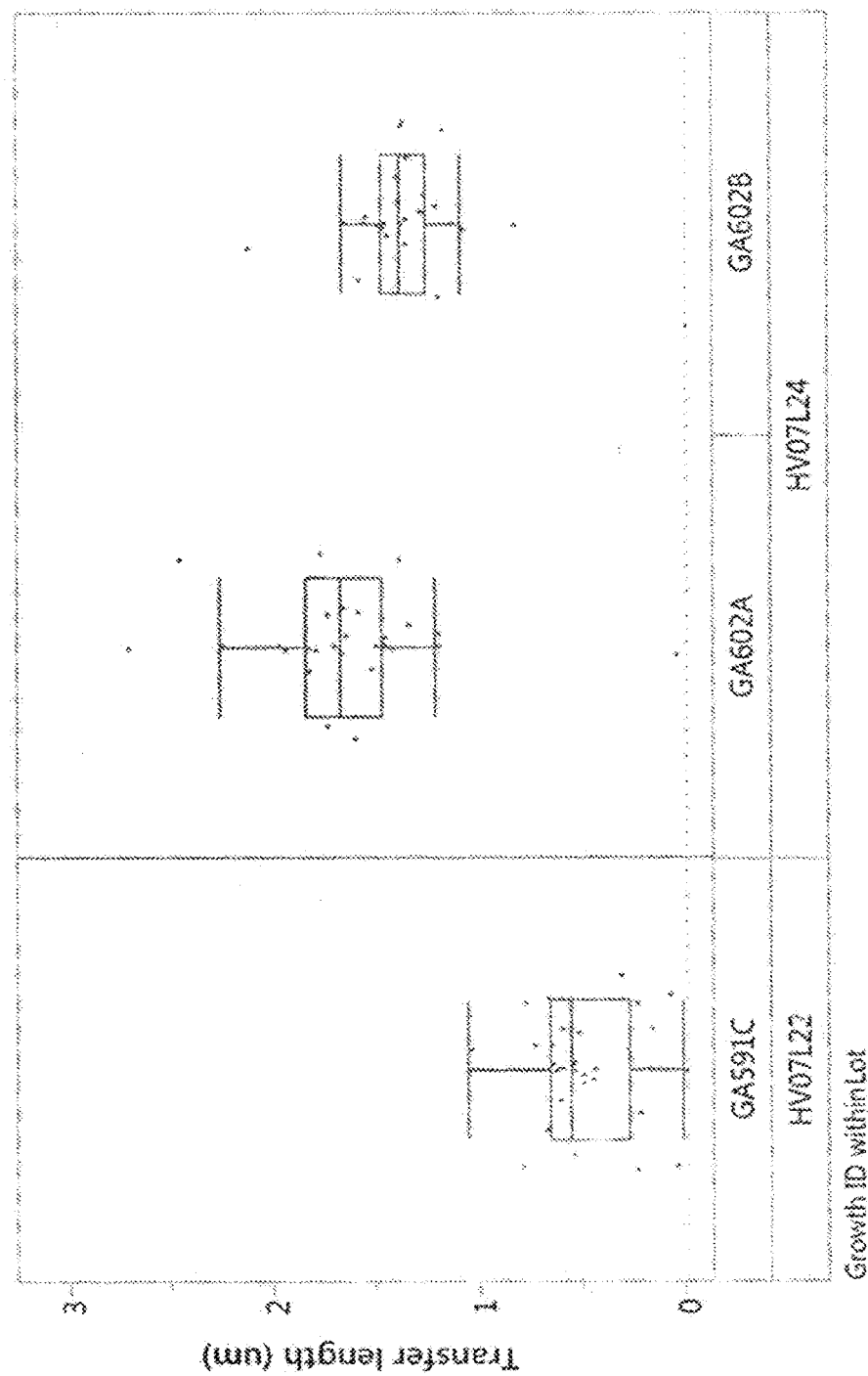

FIGS. 10A and 10B show the results from transmission line measurements (TLMs). TLM is a technique used in semiconductor physics and engineering to determine the contact resistance between a metal and a semiconductor. FIGS. 10A and 10B show the Rsh and Rt TLM results from lot HV07L22 with 40 Å of AlGaN in wafer GA591C using an RTA at 800° C. for 30 seconds; and lot HV07L24 with 50 Å of AlGaN in wafer GA602A using an RTA at 800° C. for 15 seconds, and for wafer GA602B using an RTA at 800° C. for 30 seconds. FIG. 11 shows TLM measurements of contact resistance Rc and transfer length Lt for HV07L22 and HV07L24.

Figure 12:
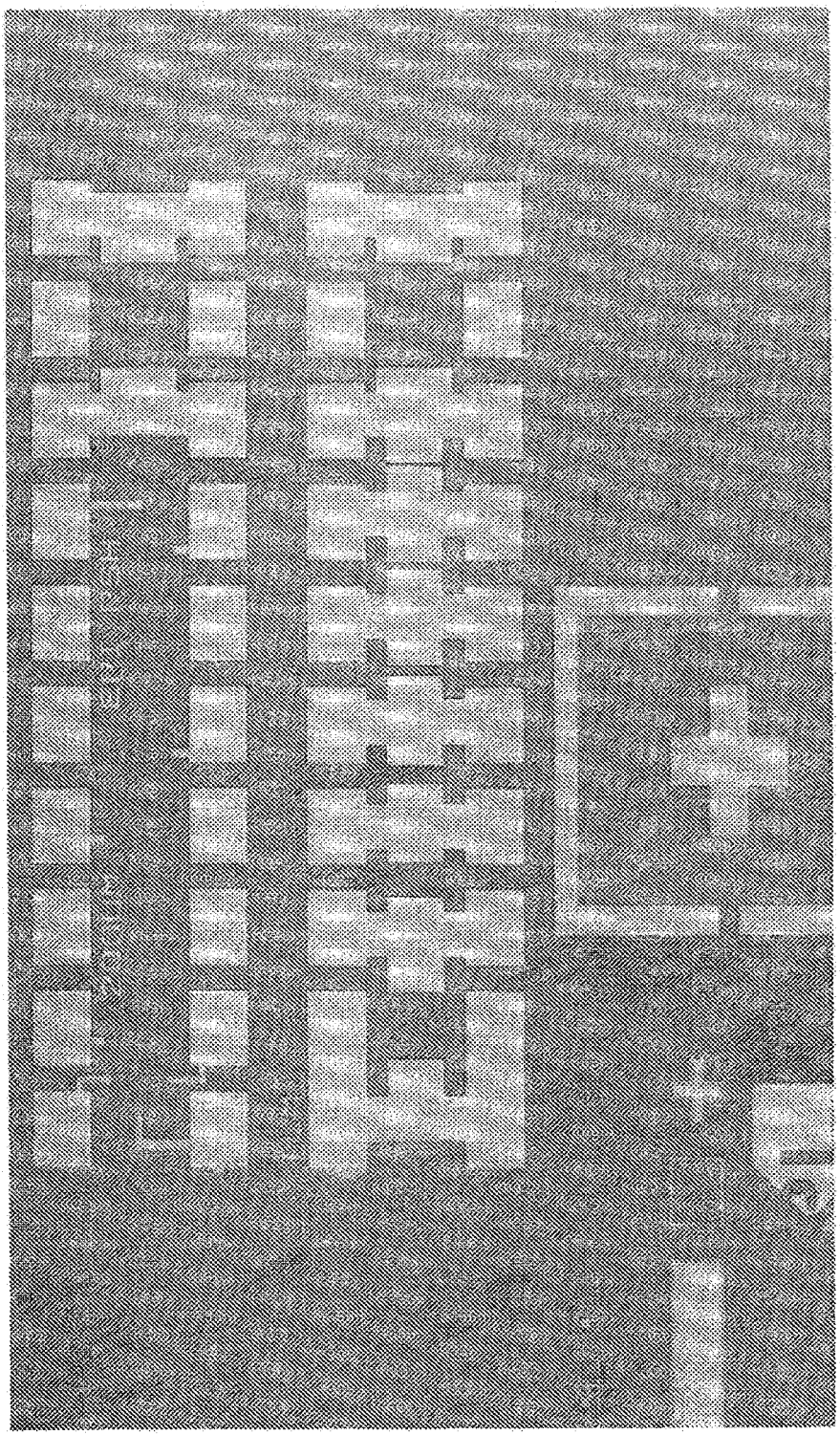
FIG. 12 shows a smooth surface morphology for Ohmic contacts in a test structure TLM in accordance with the present disclosure.

FIG. 12 shows an example of a test structure TLM fabricated according to the present disclosure on wafer GA591C of lot HV07L22 that has a smooth surface morphology for the Ohmic contacts.

Having now described the present disclosure in accordance with the requirements of the patent statutes, those skilled in this art will understand how to make changes and modifications to the present invention to meet their specific requirements or conditions. Such changes and modifications may be made without departing from the scope and spirit of the present disclosure as disclosed herein.

The foregoing Detailed Description of exemplary and preferred embodiments is presented for purposes of illustration and disclosure in accordance with the requirements of the law. It is not intended to be exhaustive nor to limit the present disclosure to the precise form(s) described, but only to enable others skilled in the art to understand how the present disclosure may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the present disclosure be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

All elements, parts and steps described herein are preferably included. It is to be understood that any of these elements, parts and steps may be replaced by other elements, parts and steps or deleted altogether as will be obvious to those skilled in the art.

CONCEPTS

This writing discloses at least the following concepts.

Concept 1. A method of forming an Ohmic contact for a field effect transistor comprising:
forming a Ta layer in a contact area of a barrier layer;
forming a Ti layer on the first Ta layer; and
forming an Al layer on the Ti layer;
wherein the barrier layer comprises AlGaN having a 10% to 40% Al composition and a thickness in a range between 30 Å to 100 Å; and
wherein the barrier layer is on a channel layer comprising GaN.

Concept 2. The method of concept 1 wherein:
the Ta layer is 400 Å thick;
the Ti layer is 500 Å thick; and
the Al layer is 500 Å thick.

Concept 3. The method of concept 1 further comprising:
forming the Ta layer by evaporation at an evaporation rate of 0.5 Å/sec-2 Å/sec; and
cooling the Ta layer after evaporation to 30° C. or less.

Concept 4. The method of concepts 1 or 3 further comprising:
rapid thermal annealing at a temperature range of 750° C. to 850° C. for 10 sec to 60 sec.

Concept 5. The method of concept 1 further comprising:
forming the GaN channel layer on a substrate, the channel layer having about a 1 μm thickness; and
forming an AlN spacer layer having a thickness of 10 Å on the channel layer and between the channel layer and the barrier layer.

Concept 6. The method of concept 1 wherein the Ohmic contact has a contact resistance of less than or equal to 0.5 Ω/mm.

Concept 7. The method of concept 1 wherein the Ta layer, the Ti layer, and the Al layer are formed by photo lithography, evaporation and liftoff or by sputtering and dry etching.

Concept 8. The method of concept 1 further comprising:
forming a passivation layer over the barrier layer using metal organic chemical vapor deposition before forming an Ohmic contact, and then using photo resist and lithography to define at least one contact area; and
removing the passivation layer in the contact area by etching the passivation layer.

Concept 9. The method of concept 1 further comprising:
forming a passivation layer over the barrier layer using plasma-enhanced chemical vapor deposition (PECVD) after forming the Ohmic contact.

Concept 10. The method of concepts 8 or 9 wherein the passivation layer comprises $Si_3N_4$.

Concept 11. The method of concept 1 wherein forming the Ta layer comprises:
forming a first 200 Å thick Ta layer in the contact area by evaporation at an evaporation rate of 0.5 Å/sec-2 Å/sec;
cooling the first Ta layer after evaporation to 30° C. or less; and
forming a second 200 Å thick Ta layer on the first Ta layer by evaporation at an evaporation rate of 0.5 Å/sec-2 Å/sec;

cooling the second Ta layer after evaporation to 30° C. or less;
forming the Ti layer on the second Ta layer; and
forming the Al layer on the Ti layer.

Concept 12. An Ohmic contact for a field effect transistor comprising:
a Ta layer in a contact area of a barrier layer;
a Ti layer on the first Ta layer; and
an Al layer on the Ti layer;
wherein the barrier layer comprises AlGaN having a 10% to 40% Al composition and a thickness in a range between 30 Å to 100 Å; and
wherein the barrier layer is on a channel layer comprising GaN.

Concept 13. The Ohmic contact of concept 12 wherein:
the Ta layer is 400 Å thick;
the Ti layer is 500 Å thick; and
the Al layer is 500 Å thick.

Concept 14. The Ohmic contact of concept 12 further comprising:
the GaN channel layer on a substrate, the channel layer having about a 1 µm thickness; and
an AlN spacer layer having a thickness of 10 Å on the channel layer and between the channel layer and the barrier layer.

Concept 15. The Ohmic contact of concept 12 wherein the Ohmic contact has a contact resistance of less than or equal to 0.5 Ω/mm.

Concept 16. The Ohmic contact of concept 12 further comprising:
a passivation layer over the barrier layer between a source contact and a drain contact.

Concept 17. The Ohmic contact of concept 16 wherein the passivation layer comprises $Si_3N_4$.

Concept 18. The Ohmic contact of concept 12 wherein the Ta layer is formed by evaporation at an evaporation rate of 0.5 Å/sec-2 Å/sec.

Concept 19. The Ohmic contact of concept 12 wherein the Ta layer comprises:
a first 200 Å thick Ta layer in the contact area formed by evaporation at an evaporation rate of 0.5 Å/sec-2 Å/sec, and cooling after evaporation to 30° C. or less; and
a second 200 Å thick Ta layer on the first Ta layer formed by evaporation at an evaporation rate of 0.5 Å/sec-2 Å/sec, and cooling the second Ta layer after evaporation to 30° C. or less;
the Ti layer on the second Ta layer; and
the Al layer on the Ti layer.

What is claimed is:

1. A method of forming an Ohmic contact for a field effect transistor comprising:
forming a Ta layer in a contact area of a barrier layer;
forming a Ti layer on the Ta layer;
forming an Al layer on the Ti layer;
forming the Ta layer by evaporation at an evaporation rate of 0.5 Å/sec to 2 Å/sec; and
cooling the Ta layer after evaporation to 30° C. or less.

2. The method of claim 1 wherein:
the Ta layer is 400 Å thick;
the Ti layer is 500 Å thick; and
the Al layer is 500 Å thick.

3. The method of claim 1 further comprising:
annealing the Ta layer, the Ti layer and the Al layer using rapid thermal annealing at a temperature range of 750° C. to 850° C. for 10 sec to 60 sec.

4. The method of claim 1:
wherein the barrier layer comprises AlGaN having a 10% to 40% Al composition and a thickness in a range between 30 Å to 100 Å; and
wherein the barrier layer is on a channel layer comprising GaN.

5. The method of claim 4 further comprising:
forming the GaN channel layer on a substrate, the channel layer having about a 1 µm thickness; and
forming an AlN spacer layer having a thickness of 10 Å on the channel layer and between the channel layer and the barrier layer.

6. The method of claim 1 wherein the Ohmic contact has a contact resistance of less than or equal to 0.5 Ωmm.

7. The method of claim 1 wherein the Ta layer, the Ti layer, and the Al layer are formed by photo lithography, evaporation and liftoff or by sputtering and dry etching.

8. The method of claim 1 further comprising:
forming a passivation layer over the barrier layer using metal organic chemical vapor deposition before forming an Ohmic contact, and then using photo resist and lithography to define at least one contact area; and
removing the passivation layer in the contact area by etching the passivation layer.

9. The method of claim 8 wherein the passivation layer comprises $Si_3N_4$.

10. The method of claim 1 further comprising:
forming a passivation layer over the barrier layer using plasma-enhanced chemical vapor deposition (PECVD) after forming the Ohmic contact.

11. The method of claim 10 wherein the passivation layer comprises $Si_3N_4$.

12. The method of claim 1 wherein forming the Ta layer comprises:
forming a first 200 Å thick Ta layer in the contact area by evaporation at an evaporation rate of 0.5 Å/sec to 2 Å/sec;
cooling the first Ta layer after evaporation to 30° C. or less;
forming a second 200 Å thick Ta layer on the first Ta layer by evaporation at an evaporation rate of 0.5 Å/sec to 2 Å/sec;
cooling the second Ta layer after evaporation to 30° C. or less; and
forming the Ti layer on the second Ta layer.

13. An Ohmic contact for a field effect transistor comprising:
a Ta layer in a contact area of a barrier layer;
a Ti layer on the Ta layer; and
an Al layer on the Ti layer;
wherein the Ta layer is formed by evaporation at an evaporation rate of 0.5 Å/sec to 2 Å/sec, and cooling the Ta layer after evaporation to 30° C. or less.

14. The Ohmic contact of claim 13 wherein:
the Ta layer is 400 Å thick;
the Ti layer is 500 Å thick; and
the Al layer is 500 Å thick.

15. The Ohmic contact of claim 13:
wherein the barrier layer comprises AlGaN having a 10% to 40% Al composition and a thickness in a range between 30 Å to 100 Å; and
wherein the barrier layer is on a channel layer comprising GaN.

16. The Ohmic contact of claim 15 further comprising:
the GaN channel layer on a substrate, the channel layer having about a 1 µm thickness; and an AlN spacer layer having a thickness of 10 Å on the channel layer and between the channel layer and the barrier layer.

17. The Ohmic contact of claim 13 wherein the Ohmic contact has a contact resistance of less than or equal to 0.5 Ωmm.

18. The Ohmic contact of claim 13 further comprising:
a passivation layer over the barrier layer between a source contact and a drain contact.

19. The Ohmic contact of claim 18 wherein the passivation layer comprises $Si_3N_4$.

20. The Ohmic contact of claim 13 wherein the Ta layer comprises:
a first 200 Å thick Ta layer in the contact area formed by evaporation at an evaporation rate of 0.5 Å/sec to 2 Å/sec, and cooling the first 200 Å thick Ta layer after evaporation to 30° C. or less; and
a second 200 Å thick Ta layer on the first 200 Å thick Ta layer formed by evaporation at an evaporation rate of 0.5 Å/sec to 2 Å/sec, and cooling the second 200 Å thick Ta layer after evaporation to 30° C. or less;
wherein the Ti layer is on the second 200 Å thick Ta layer.

21. A method of forming an Ohmic contact for a field effect transistor comprising:
forming a Ta layer in a contact area of a barrier layer;
forming a Ti layer on the Ta layer;
forming an Al layer on the Ti layer; and
annealing the Ta layer, the Ti layer, and the Al layer using rapid thermal annealing only for 10 sec to 60 sec at a temperature range of 750° C. to 850° C.

22. The method of claim 21 wherein:
the Ta layer is 400 Å thick;
the Ti layer is 500 Å thick; and
the Al layer is 500 Å thick.

23. The method of claim 21 further comprising:
forming the Ta layer by evaporation at an evaporation rate of 0.5 Å/sec to 2 Å/sec; and
cooling the Ta layer after evaporation to 30° C. or less.

24. The method of claim 21 wherein the Ohmic contact has a contact resistance of less than or equal to 0.5 Ωmm.

25. The method of claim 21 wherein the Ta layer, the Ti layer, and the Al layer are formed by photo lithography, evaporation and liftoff or by sputtering and dry etching.

26. The method of claim 21 wherein forming the Ta layer comprises:

forming a first 200 Å thick Ta layer in the contact area by evaporation at an evaporation rate of 0.5 Å/sec to 2 Å/sec;
cooling the first 200 Å thick Ta layer after evaporation to 30° C. or less;
forming a second 200 Å thick Ta layer on the first 200 Å thick Ta layer by evaporation at an evaporation rate of 0.5 Å/sec to 2 Å/sec;
cooling the second 200 Å thick Ta layer after evaporation to 30° C. or less;
forming the Ti layer on the second 200 Å thick Ta layer; and
forming the Al layer on the Ti layer.

27. An Ohmic contact for a field effect transistor comprising:
a Ta layer in a contact area of a barrier layer;
a Ti layer on the Ta layer;
an Al layer on the Ti layer; and
wherein the Ta layer, the Ti layer, and the Al layer are annealed using rapid thermal annealing only for 10 sec to 60 sec at a temperature range of 750° C. to 850° C.

28. The Ohmic contact of claim 27 wherein:
the Ta layer is 400 Å thick;
the Ti layer is 500 Å thick; and
the Al layer is 500 Å thick.

29. The Ohmic contact of claim 27 further comprising:
wherein the Ta layer is formed by evaporation at an evaporation rate of 0.5 Å/sec to 2 Å/sec, and cooling the Ta layer after evaporation to 30° C. or less.

30. The Ohmic contact of claim 27 wherein the Ohmic contact has a contact resistance of less than or equal to 0.5 Ωmm.

31. The Ohmic contact of claim 27 wherein the Ta layer comprises:
a first 200 Å thick Ta layer in the contact area formed by evaporation at an evaporation rate of 0.5 Å/sec to 2 Å/sec, and cooling the first 200 Å thick Ta layer after evaporation to 30° C. or less; and
a second 200 Å thick Ta layer on the first 200 Å thick Ta layer formed by evaporation at an evaporation rate of 0.5 Å/sec to 2 Å/sec, and cooling the second 200 Å thick Ta layer after evaporation to 30° C. or less;
wherein the Ti layer is on the second 200 Å thick Ta layer.

* * * * *